(12) United States Patent
Jørgensen

(10) Patent No.: US 7,388,363 B2
(45) Date of Patent: Jun. 17, 2008

(54) DETECTOR CIRCUIT TO BE USED FOR MEASURING CURRENT

(75) Inventor: Hans Erik Jørgensen, Jyllinge (DK)

(73) Assignee: Danfysik A/S, Jylilnge (DK)

( * ) Notice: Subject to any disclaimer, the term of this patent is extended or adjusted under 35 U.S.C. 154(b) by 206 days.

(21) Appl. No.: 10/579,967

(22) PCT Filed: Nov. 26, 2004

(86) PCT No.: PCT/DK2004/000820

§ 371 (c)(1),
(2), (4) Date: May 23, 2006

(87) PCT Pub. No.: WO2005/052605

PCT Pub. Date: Jun. 9, 2005

(65) Prior Publication Data

US 2007/0145968 A1    Jun. 28, 2007

(30) Foreign Application Priority Data

Nov. 27, 2003  (DK) ............................... 2003 01752

(51) Int. Cl.
*G01R 33/00* (2006.01)
(52) U.S. Cl. .................................. 324/117 R
(58) Field of Classification Search ............ 324/117 H, 324/117 R, 765, 760, 126, 127, 158.1; 363/56, 363/13; 323/357–358
See application file for complete search history.

(56) References Cited

U.S. PATENT DOCUMENTS 4,536,706 A    8/1985  Kemper 4,912,396 A  *  3/1990  Groenenboom ......... 324/117 R
4,952,853 A  *  8/1990  Archer ....................... 318/284

FOREIGN PATENT DOCUMENTS

| EP | 0 261 707 A1 | 3/1988 |
|---|---|---|
| EP | 0 314 234 A1 | 5/1989 |
| JP | 2003-315374 A | 11/2003 |

* cited by examiner

*Primary Examiner*—Ha Tran Nguyen
*Assistant Examiner*—Tung X. Nguyen
(74) *Attorney, Agent, or Firm*—Birch, Stewart, Kolasch & Birch, LLP

(57) ABSTRACT

A detector circuit is to be used for measuring current by means of substantially identically wound ring core transformers, in which magnetomotive forces are induced by a main current. The magnetomotive forces are counteracted by magnetomotive forces induced by a compensating current. Two of the ring core transformers (2, 3) are magnetized in antiphase by means of a modulation signal. The detector circuit includes optionally a synchronous rectifier for providing an adjusting signal for the compensating current. According to the invention means are provided for compensating for possible differences between the two ring core transformers for the modulation signal. These means include a common winding surrounding the two ring cores (2, 3), said common winding detecting a possible error signal used in a negative feedback loop which automatically seeks to establish an equilibrium.

6 Claims, 4 Drawing Sheets

DETECTOR CIRCUIT TO BE USED FOR MEASURING CURRENT

The invention relates to a detector circuit to be used for measuring current by means of substantially identically wound ring core transformers, in which magnetomotive forces are induced by a main current, said magnetomotive forces being counteracted by magnetomotive forces induced by a compensating current, and where a magnetization is carried out in antiphase by means of a modulation current, said detector circuit optionally also including a synchronous rectifier for generating an adjusting signal for the compensating current, and where means are provided for compensating for possible differences between the two ring core transformers.

BACKGROUND ART

Danish Patent No. 149238 discloses a zero-flux current transformer for measuring the current for an electromagnet in a particle accelerator. As very high current values are involved, viz. several hundred amperes, the main current is advantageously converted into a comparatively weaker measuring current which is easy to handle, and which is passed through a measuring resistor. As a result the voltage drop across the measuring resistor can be used as a measurement representing the value of the main current.

The known zero-flux current transformers are formed by a combination of a magnetic integrator and a 2nd harmonic modulator. In principle a magnetic integrator includes a ring core of a ferromagnetic material, said ring core being provided with a primary winding, a secondary winding and a sensing winding. The sensing winding communicates with the inlet terminals of an amplifier driving the secondary current through a measuring resistor. Therefore an alteration of the magnetic flux in the ring core induces a voltage in the sensing winding, and this voltage affects the amplifier in such a manner that said magnetic flux generates a compensating current which counteracts the alteration of the flux caused by the primary current. As a result the magnetomotive forces generated by the current through the primary winding are equalized by the magnetomotive forces generated by the current through the secondary winding in such a manner that a specific relationship exists between the current value in the primary winding and the current value in the secondary winding.

However, the magnetic integrator cannot handle DC and very low frequencies, and accordingly it is necessary to include a separate circuit for this function. Such a circuit is formed by a magnetic modulator including two identically wound ring cores and a driver circuit. The ring cores are driven in saturation, and at a balance/"zero flux" the current curves are symmetrical relative to zero with the result that the contents of equal harmonics are zero. Therefore it is possible to use either a direct, symmetrical detection by means of a window comparator/Schmitt trigger or a second harmonic detector using synchronous rectification of the current signal presenting the double frequency of the modulation signal. In both cases an output signal is obtained which is zero at a balancing between the primary and the secondary ampere winding number. An unbalance results in a voltage of an amplitude and a polarity which depend on the degree and polarity of said unbalance. One ring core suffices for carrying out the latter detector function, but it is necessary to involve two cores in antiphase in order to prevent the compensating circuit from suppressing the detection and in order to prevent the modulation signal from disturbing the magnetic integrator through a magnetic coupling. However, the two cores cannot be completely identical.

U.S. Pat. No. 4,536,706 discloses a magnetic current sensor for measuring the currents in a telephone circuit, i.e. relatively weak currents. This current sensor includes an offset correction circuit, and this offset correction circuit is only capable of carrying out an offset correction while the measuring of the current has been interrupted.

DESCRIPTION OF THE INVENTION

The object of the invention is therefore to show how it is possible in a simple manner to carry out a correction while the measuring of the current is carried out. This object is according to the invention obtained by the means for compensating for possible differences between the ring core transformers being formed by a common winding surrounding the two ring cores, said common winding detecting a possible error signal used in a negative feedback loop which automatically seeks to establish an equilibrium.

An active compensation may according to the invention be carried out by one core being used as a detector, viz. a master, while the second core is used as a slave. Then a winding surrounding both cores catches a difference signal/error signal which is amplified and added to the control signal for the slave core with the result that the signal coupled to the compensating circuit is reduced approximately 50 times.

Moreover, a negative feedback loop may according to the invention be provided for establishing the compensation, said negative feedback loop being provided by adding the error signal to the modulation signal in such a manner that said error signal is reduced. The modulation signal can be generated either from the outside or by means of a built-in multivibrator, optionally a multivibrator including a Schmitt trigger.

Two cores are supplied with modulation signals, and in order to compensate for said two cores being allowed to go into saturation, an additional core can be added, said additional core not entering saturation because it is not supplied with a modulation signal. As a result, a reduction of approximately 500 to 1000 times is obtained.

BRIEF DESCRIPTION OF THE DRAWINGS

The invention is explained in greater detail below with reference to the accompanying drawings, in which.

BEST MODE FOR CARRYING OUT THE INVENTION

Figure 1:
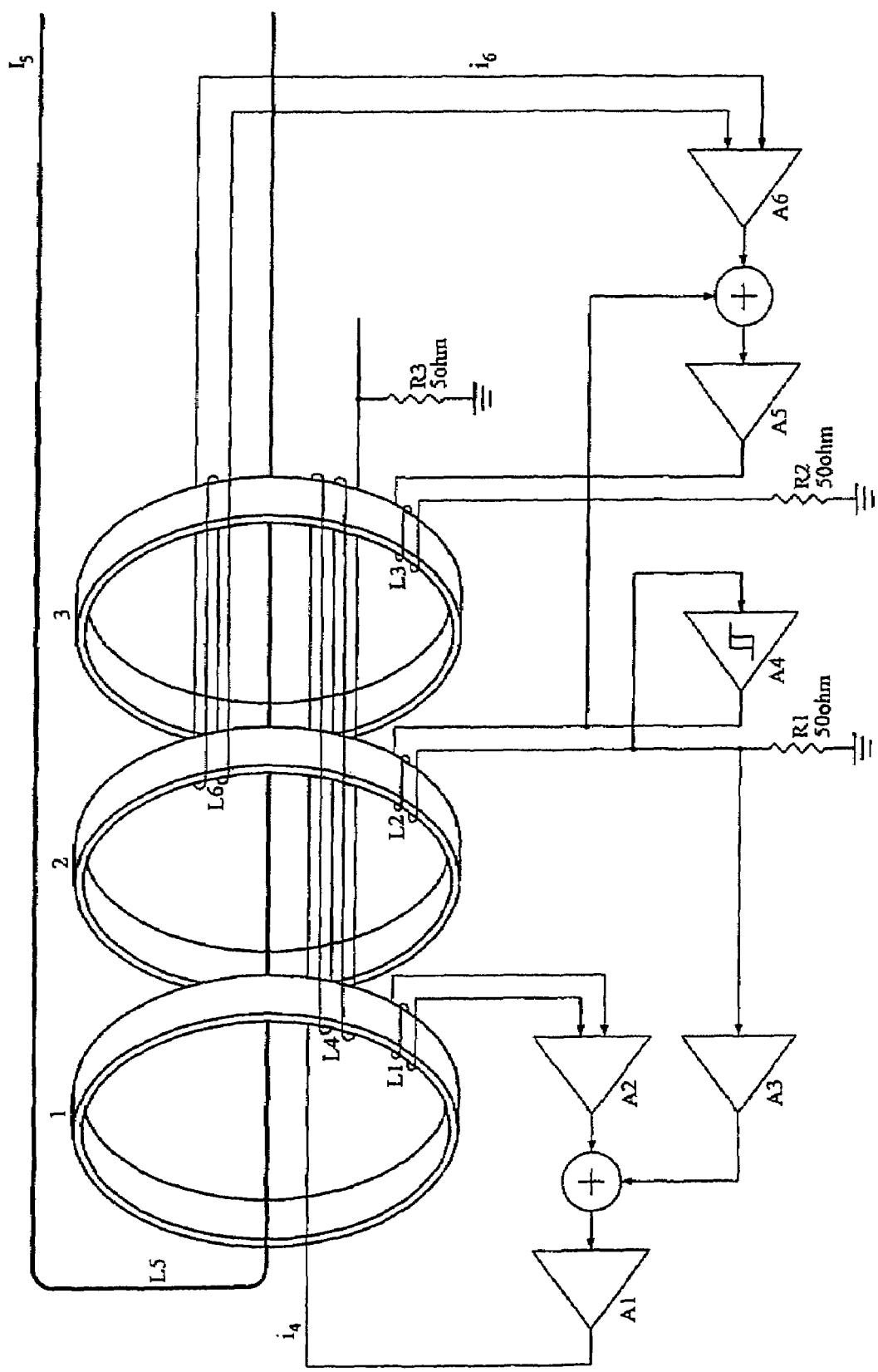
FIG. 1 illustrates an astable detector circuit with a zero detector noise reduction and including three ring cores.
Figure 2:
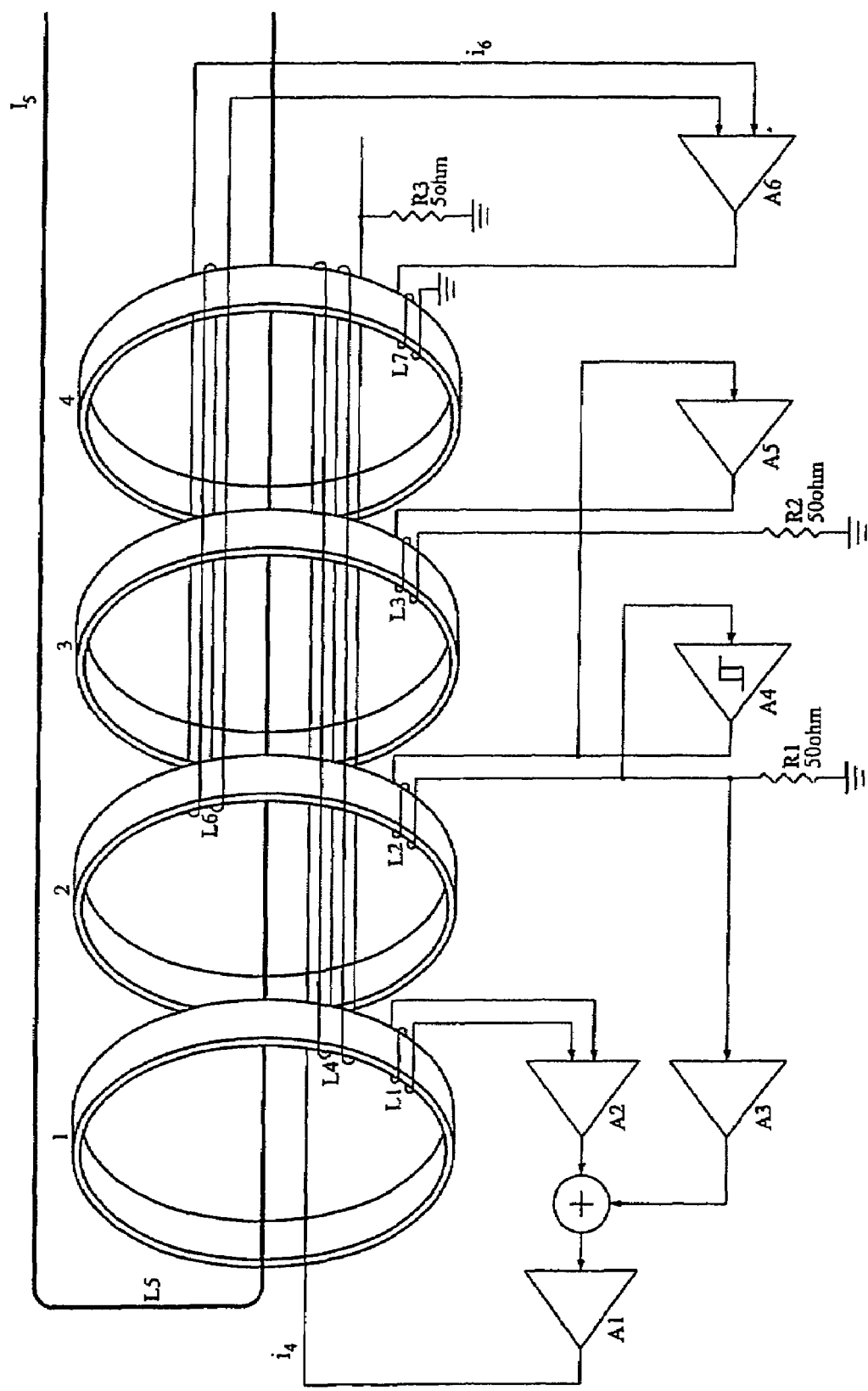
FIG. 2 illustrates an astable detector circuit with a zero detector noise reduction and including four ring cores.

The detector circuit shown in FIG. 1 is to be used for measuring strong currents, and it includes three substantially identical ring cores 1, 2, 3. A main current $I_5$ flows through the three substantially identical ring cores and induces magnetomotive forces which are to be counteracted by a compensating current $i_4$. A modulation signal in form of a square wave signal of a frequency of a few hundred Hz is fed to two of these ring cores 2, 3, the square wave signal fed to the first ring core 2 being inverted relative to the square wave signal fed to the second ring core 3. As a result, the two ring cores 2, 3 are magnetized in antiphase in such a manner that both the unequal and the equal harmonics are substantially compensated for through a coupling via the windings L1, L4 and L5.

However, the invention is based on the fact that the average flux in the ring cores is zero when an equilibrium or a balance exists between the fields induced by the main current and the compensating current. When the average flux differs from zero due to an unbalance between the induced fields, viz. an unbalance between the ampere winding numbers of the main current $I_5$ and of the compensating current $i_4$, then the magnetizing current in the modulation windings include equal harmonics where the second harmonic is the most important harmonic. A detection of the latter second harmonic results in a DC signal corresponding to the unbalance being derived, said DC signal being used for controlling an amplifier in such a manner that the balance between the magnetomotive forces induced by the primary current and the secondary current is re-established.

A specific embodiment of such a detector circuit appears from FIG. 1. The modulation signal is generated by means of a Schmitt trigger A4, the output of which communicates with a first terminal of the winding L2, and the input of which communicates with the second terminal of the winding L2. This circuit is astable. The voltage drop across the winding L2 decreases to almost zero, and the voltage drop across the resistance R1 (50Ω) increases just at the moment when a positive voltage is applied onto the winding L2 in such a manner that a positive voltage is applied onto the input of the Schmitt trigger A4. This positive voltage has the effect that a current flows through the winding L2 and causes the ring core 2 to be saturated, whereafter the Schmitt trigger A4 alters its state in such a manner that an astable circuit is provided.

The square wave signal at the output of the Schmitt trigger A4 is also transmitted to the input of an amplifier A5, the output of which feeds the winding L3. As a result, the winding L3 is fed with a square wave signal in antiphase relative to the square wave signal fed to the winding L2.

The signal value across the resistance R1 corresponds to the signal value at the inlet of the Schmitt trigger A4. Through a low-pass amplifier A3 the signal value across the resistance R1 is also transmitted to an adding unit in which it is added to a signal detected by the winding L1 so as to provide the compensating current $i_4$. As a result, the latter compensating current is capable of compensating for both slow and fast variations in the main current $I_5$.

Furthermore, means are according to the invention provided for compensating for the two ring cores 2, 3 not being completely identical. These means include a common winding L6 surrounding the two ring cores 2, 3. The common winding L6 detects a possible error signal $i_6$, which is added to the modulation signal transmitted to the ring core 3. The error signal is transmitted in such a manner that a negative feedback loop is established, said negative feedback loop automatically seeking to establish an equilibrium. In other words, the modulation signal to the ring core 3 is altered until the error signal is substantially zero.

However, the error signal cannot be exactly zero.

The latter is inter alia due to the fact that mainly the adjustment is only efficient as long as the ring core 3 is not in saturation, which, if desired, can be compensated for by including a further ring core 4 not going into saturation because it is not supplied with a modulation signal.

In the latter case, the compensating means include a common winding L6 surrounding the three ring cores 2, 3, 4. This common winding L6 detects a possible error signal originating from the ring cores 2 and 3, and this error signal is used for influencing the magnetizing in the ring core 4. As a result, an additional reduction of the error signal is obtained and consequently a very accurate measuring of the main current $I_5$ is obtained.

Figure 3:
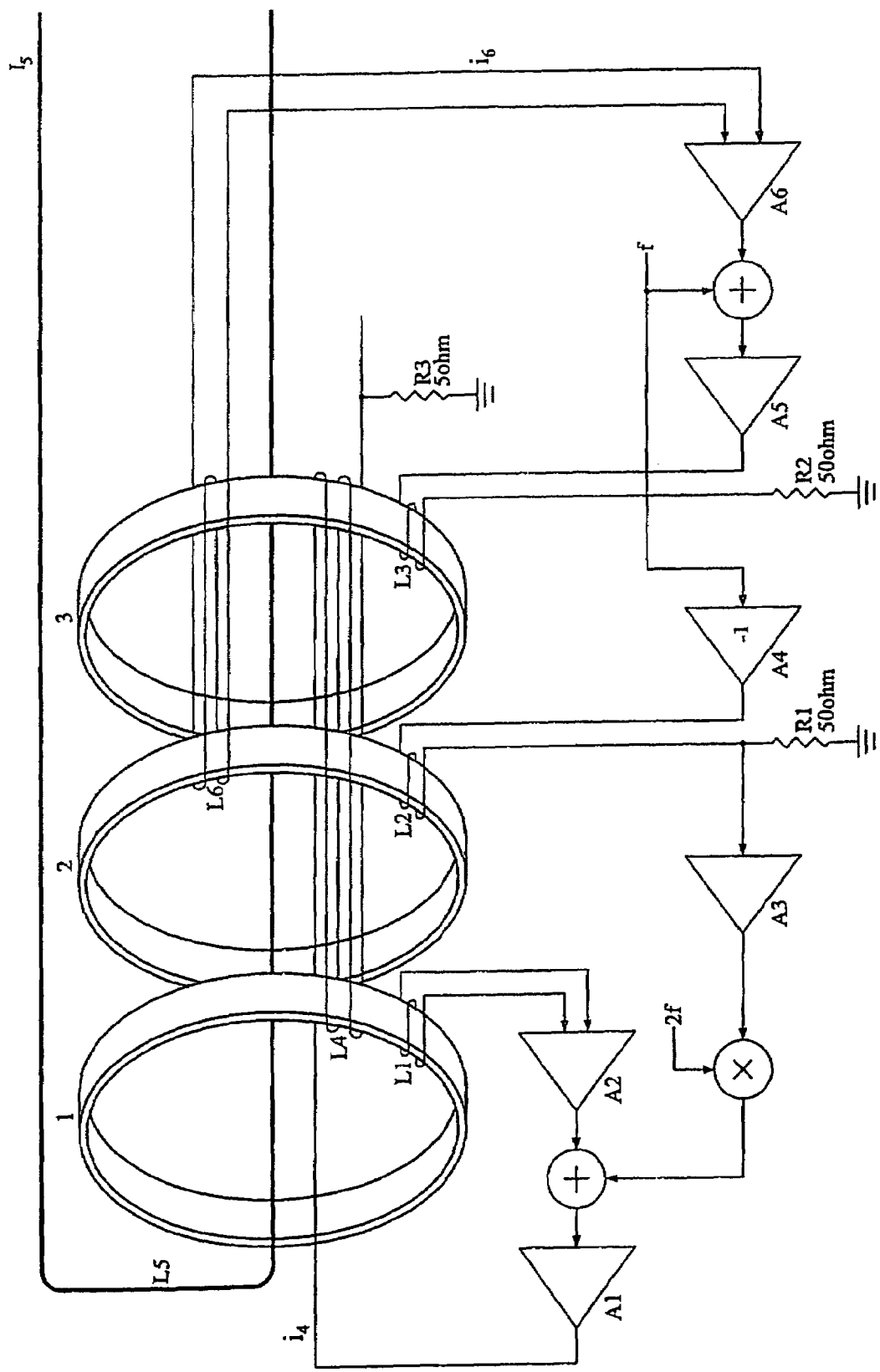
FIG. 3 illustrates a detector circuit including three ring cores, a modulation signal being applied from the outside.

According to an alternative embodiment cf. FIG. 3, the astable circuit has been replaced by a circuit which is positively operated from the outside by a modulation signal in form of an AC signal transmitted to the winding L2, said AC signal preferably being a square wave signal of a frequency of a few hundred Hz, and by an AC signal, preferably in the form of a square wave signal, being transmitted to the winding L3 and being inverted relative to the above signal. As a result, the two windings L2 and L3 are magnetized in antiphase.

The signal voltage across the resistance R1 is transmitted to an amplifier A3 and amplified, whereafter the amplified signal voltage is multiplied with a signal of the frequency 2 f, viz. synchronous rectification. The mixed signal is then added to the signal detected by the winding L1.

Also in this case, means can according to the invention be provided for compensating for the two ring cores 2, 3 not being completely identical, cf. FIG. 3. Like in FIG. 1, these means are formed by a common winding L6 surrounding the two ring cores 2, 3, said common winding L6 detecting a possible error signal being added to the modulation signal transmitted to the ring core 3. The error signal is transmitted in such a manner that a negative feedback loop is established, said negative feedback loop automatically seeking to establish an equilibrium. In other words, the modulation signal to the ring core 3 is altered until the error signal is substantially zero.

As in the circuit configuration shown in FIG. 1, the adjustment is only efficient as long as the ring core 3 is not in saturation. An additional ring core 4 can be added, cf. FIG. 4, in order to compensate for the above situation, said additional ring core not entering saturation because no modulation signal is transmitted to this core 4.

Figure 4:
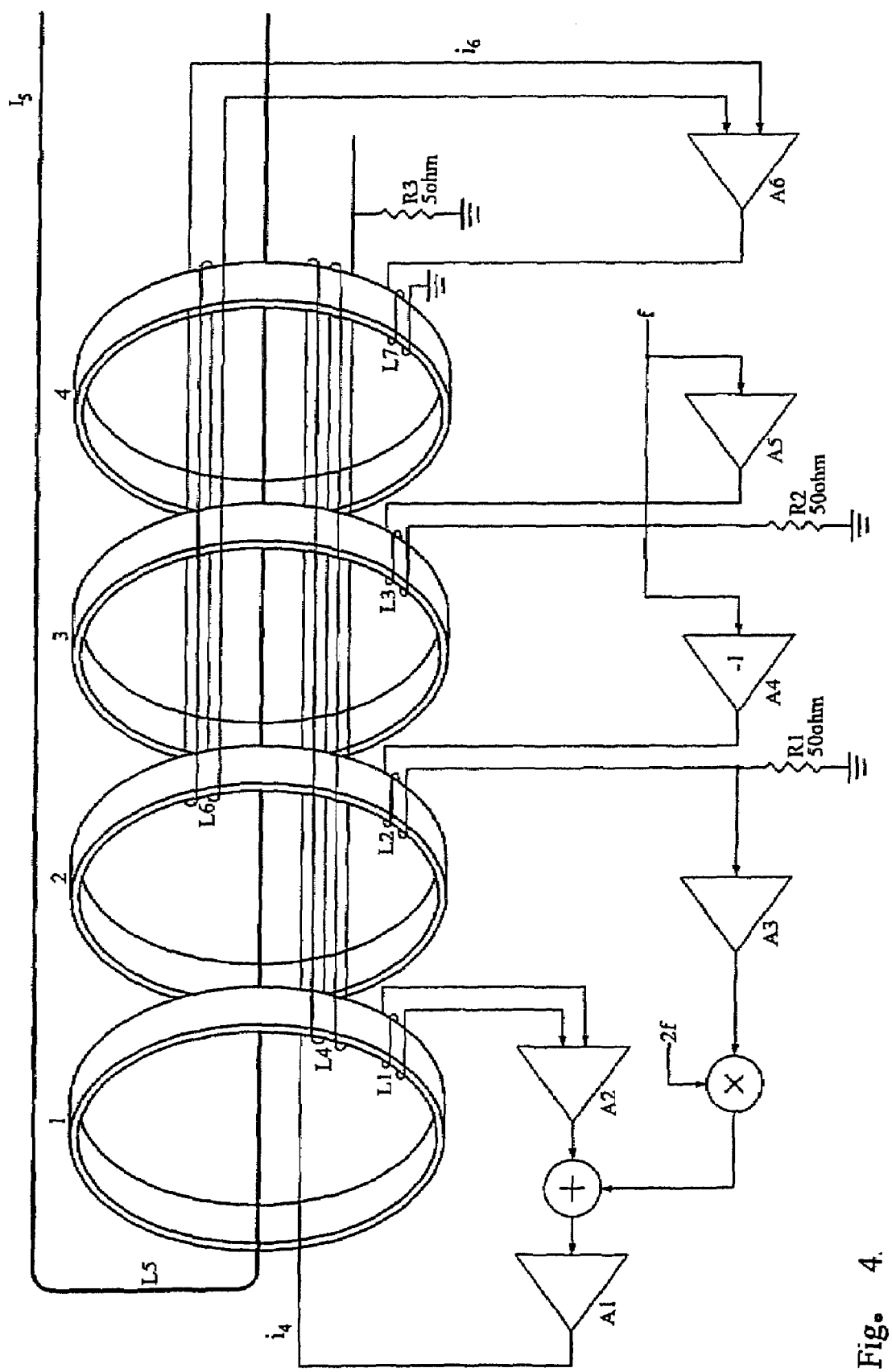
FIG. 4 illustrates a detector circuit including four ring cores, a modulation signal being applied from the outside.

In the circuit configuration shown in FIG. 4, the above compensating means are formed by a common winding L6 across the three ring cores 2, 3, 4, said common winding L6 detecting a possible error signal originating from the ring cores 2 and 3 and being utilized for influencing the magnetizing in the ring core 4.

The described detector circuits can for instance be used for measuring strong currents, viz. magnetizing currents for particle accelerators.

The invention claimed is:

1. A detector circuit to be used for measuring current by means of substantially identically wound ring core transformers, in which magnetomotive forces are induced by a main current ($I_5$), said magnetomotive forces being counteracted by magnetomotive forces induced by a compensating current ($i_4$), and where two of the ring core transformers (2, 3) are magnetized in antiphase by means of a modulation current, said detector circuit optionally also including a synchronous rectifier for generating an adjusting signal for the compensating current, and where means are provided for compensating for possible differences between the two ring core transformers (2, 3), characterised by the means for compensating for possible differences between the ring core transformers (2, 3) being formed by a common winding (L6) surrounding the two ring cores (2, 3), said common winding (L6) detecting a possible error signal used in a negative feedback loop which automatically seeks to establish an equilibrium.

2. A detector circuit according to claim 1, characterised by the negative feedback loop being provided by adding the error signal to the modulation signal in such a manner that said error signal is reduced and automatically seeks to reach zero.

3. A detector circuit according to claim 1, characterised by the modulation signal being supplied from the outside.

4. A detector circuit according to claim 1, characterised by being astable, the modulation signal being provided by means of a built-in multivibrator.

5. A detector according to claim 4, characterised by the multivibrator including a Schmitt trigger (A4).

6. A detector circuit according to claim 1, characterised in that an additional core (4) is added, said additional core not entering saturation because it is not supplied with a modulation signal, said additional ring core (4) being adapted to compensate for the ring cores (2, 3) receiving modulation signals being able to go into saturation.

* * * * *